United States Patent
Tailliet et al.

(10) Patent No.: US 9,123,413 B2
(45) Date of Patent: Sep. 1, 2015

(54) METHOD FOR MANAGING THE OPERATION OF A MEMORY DEVICE HAVING A SRAM MEMORY PLANE AND A NON VOLATILE MEMORY PLANE, AND CORRESPONDING MEMORY DEVICE

(71) Applicant: STMicroelectronics (Rousset) SAS, Rousset (FR)

(72) Inventors: François Tailliet, Fuveau (FR); Marc Battista, Marseilles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/315,401

(22) Filed: Jun. 26, 2014

(65) Prior Publication Data

US 2015/0016188 A1    Jan. 15, 2015

(30) Foreign Application Priority Data

Jul. 9, 2013    (FR) ..................... 13 56720

(51) Int. Cl.
| | |
|---|---|
| *G11C 11/34* | (2006.01) |
| *G11C 14/00* | (2006.01) |
| *G11C 7/10* | (2006.01) |
| *G11C 16/04* | (2006.01) |
| *G11C 16/34* | (2006.01) |

(52) U.S. Cl.
CPC .......... *G11C 14/0063* (2013.01); *G11C 7/1006* (2013.01); *G11C 16/0408* (2013.01); *G11C 16/3418* (2013.01)

(58) Field of Classification Search
CPC ............................ G11C 14/00; G11C 14/0018
USPC ................. 365/185.08, 154, 189.14, 189.15, 365/189.16
See application file for complete search history.

(56) References Cited

U.S. PATENT DOCUMENTS

| | | | |
|---|---|---|---|
| 4,132,904 | A | 1/1979 | Harari |
| 4,337,522 | A | 6/1982 | Stewart |
| 4,467,451 | A | 8/1984 | Moyer |
| 4,980,859 | A | 12/1990 | Guterman et al. |
| 5,519,663 | A | 5/1996 | Harper, Jr. et al. |
| 6,097,618 | A | 8/2000 | Jenne |
| 6,556,487 | B1 * | 4/2003 | Ratnakumar et al. .... 365/185.08 |

(Continued)

FOREIGN PATENT DOCUMENTS

| | | |
|---|---|---|
| FR | 1355439 A | 3/1964 |
| FR | 1355440 A | 3/1964 |

OTHER PUBLICATIONS

Prakash, "Nonvolatile SRAM (nvSRAM) Basics," Cypress Perform, Oct. 2013, 9 pages.

*Primary Examiner* — Son Dinh
(74) *Attorney, Agent, or Firm* — Slater & Matsil, L.L.P.

(57) ABSTRACT

A method can be used for managing the operation of a memory cell that includes an SRAM elementary memory cell and a non-volatile elementary memory cell coupled to one another. A data bit is transferred between the SRAM elementary memory cell and the non-volatile elementary memory cell. A control datum is stored in a control memory cell that is functionally analogous to and associated with the memory cell. The data bit is read from the SRAM elementary memory cell and a corresponding read of the control datum is performed. The data bit read from the SRAM elementary memory cell is inverted if the control datum has a first value but the data bit read from the SRAM elementary memory cell is not inverted if the control datum has a second value.

28 Claims, 11 Drawing Sheets

(56) References Cited

U.S. PATENT DOCUMENTS

| | | |
|---|---|---|
| 7,164,608 B2 | 1/2007 | Lee |
| 7,483,290 B2 * | 1/2009 | Kikuchi et al. ............ 365/154 |
| 8,018,768 B2 | 9/2011 | Shih et al. |
| 8,331,150 B2 | 12/2012 | Hsu et al. |
| 2006/0023503 A1 | 2/2006 | Lee |
| 2011/0044109 A1 | 2/2011 | Shih et al. |

* cited by examiner

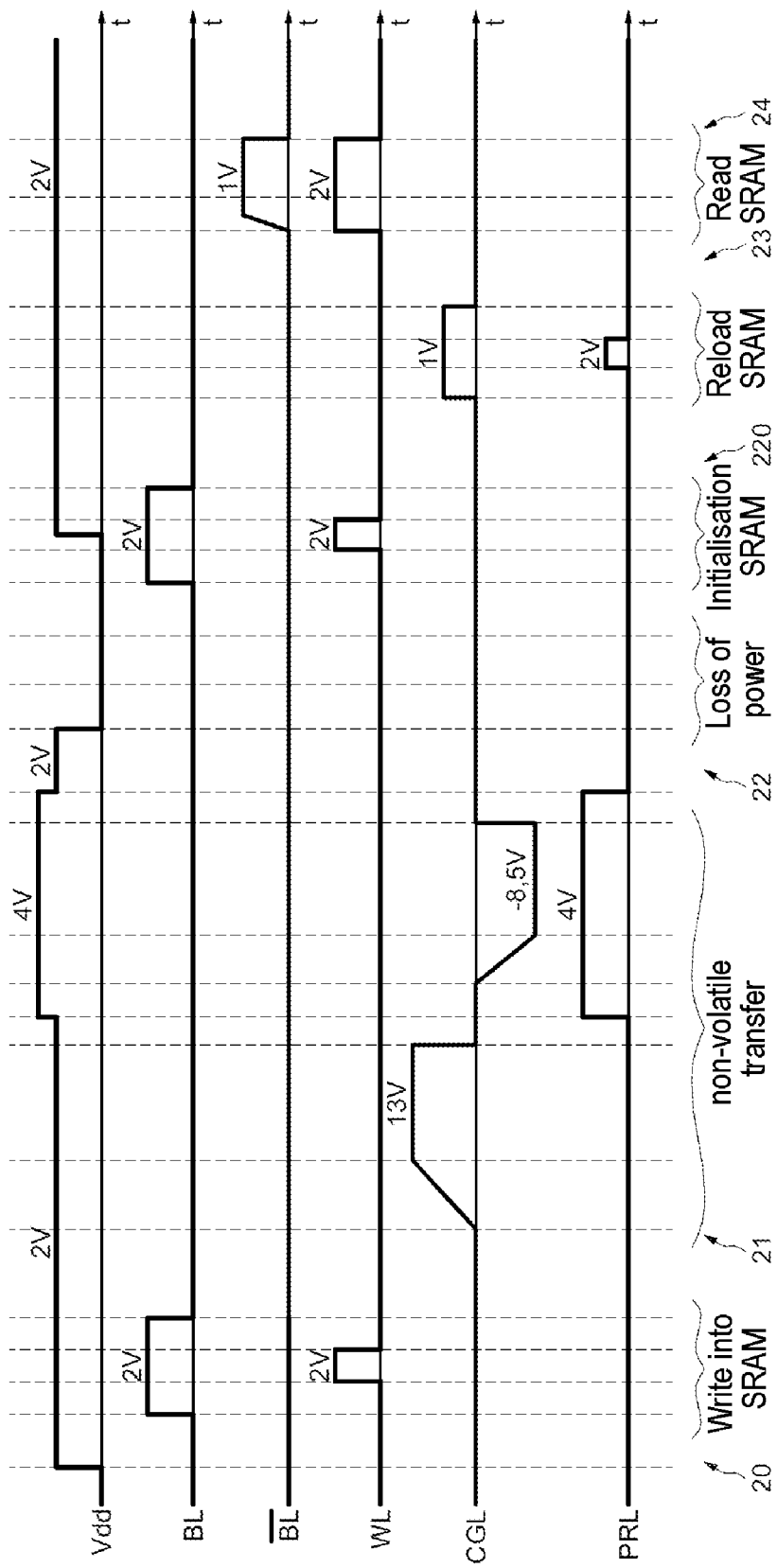

METHOD FOR MANAGING THE OPERATION OF A MEMORY DEVICE HAVING A SRAM MEMORY PLANE AND A NON VOLATILE MEMORY PLANE, AND CORRESPONDING MEMORY DEVICE

This application claims the benefit of French Application No. 1356720, filed on Jul. 9, 2013, which application is hereby incorporated herein by reference.

TECHNICAL FIELD

The present invention relates generally to memory and, in particular embodiments to a method for managing the operation of a memory device having an SRAM memory plane and a non-volatile memory plane.

BACKGROUND

An SRAM elementary memory cell is a volatile memory cell, i.e., losing its data in the event of a loss of power, but offering a very high access speed and an infinite cycling. A non-volatile elementary memory cell, for example an EEPROM memory cell, allows the datum to be saved in the event of a loss of power, but cannot be cycled indefinitely.

A memory cell associating an SRAM elementary cell and one or more non-volatile cells (for example two or four) allows the performances of the two approaches to be cumulated, i.e., the speed and the infinite endurance of the SRAM memory and the non-volatility of the non-volatile memory, for example the flash or EEPROM memory.

Under normal operating conditions, the writing and reading of a datum in a memory cell of this type are carried out in the SRAM elementary cell. Conversely, notably in the event of a loss of power, the contents of the SRAM elementary cell are transferred into the non-volatile elementary memory cell(s) associated with it.

Then, notably when power is restored, the data contained in the non-volatile memory cells are reloaded into the corresponding SRAM elementary memory cell.

Examples of architectures of memory cells of this type associating an SRAM memory and a non-volatile memory are described in U.S. Pat. Nos. 4,132,904; 4,467,451; 4,980,859; 7,164,608; and 8,018,768 and in the French patent applications filed under the numbers FR1355439 and FR1355440.

Some embodiments of these structures described in these documents present a data inversion in the reloading of the SRAM memory by the contents of the associated non-volatile memory.

SUMMARY

Embodiments of the invention relate to memory devices, notably those associating a Static Random Access Memory (SRAM) elementary cell within a memory cell and one or more non-volatile elementary memory cells, for example two or four, in particular Electrically-Erasable and Programmable Read-Only Memory (EEPROM) elementary memory cells, although it is possible to use non-volatile FLASH cells.

Particular embodiments of the invention relate to the management of the inversion of the data in a reloading of the SRAM memory by the associated non-volatile memory.

A plurality of solutions can be envisaged for managing this data inversion. A first approach may consist in carrying out a double non-volatile storage, i.e., two successive inversions. However, such an approach incurs a double cost in terms of time and energy.

A different envisaged approach may consist in crossing the connections of the elementary memory cells between the non-volatile writing and the reloading of the SRAM elementary memory cell. However, this incurs a cost in terms of size.

A different approach may consist in carrying out the reloading of the SRAM elementary memory cell from the non-volatile elementary memory cells by drawing on the supply voltage Vdd. However, this then imposes constraints on the dimensioning of the elementary memory cells and cell current constraints (substantial currents are required and there is also the risk of losing the charge of the non-volatile elementary memory cell (a phenomenon known to the person skilled in the art as "disturb").

According to one embodiment, a method and a memory device are proposed which offer a management of the data inversion in the reloading of the SRAM cell by the non-volatile cell(s) which is totally different from the management methods of the prior art and which is more efficient in terms of write speed and power consumption.

According to one embodiment, it is proposed not to modify the existing configuration of a memory cell resulting in a data inversion in the reloading of the SRAM cell from the non-volatile cell, whether it be in structural terms or in terms of power supply, but to associate a control cell with one or more of these memory cells which will enable detection of the inversion or not of a datum read from the SRAM elementary memory cell.

Thus, according to one aspect, a method is proposed for managing the operation of a set of at least one memory cell of the type comprising an SRAM elementary memory cell and at least one non-volatile elementary memory cell coupled to one another. The at least one memory cell can be configured to carry out a datum value inversion in a reloading into the SRAM cell of a datum previously written into the at least one non-volatile elementary memory cell.

A method is implemented according to this method aspect. With each transfer of a datum from the SRAM elementary memory cell into the at least one non-volatile elementary memory cell, and with each reloading of the SRAM elementary memory cell, a respective implementation of the same operations on a control datum of a control memory cell functionally analogous to and associated with the at least one memory cell is performed. With each reading of the datum from the SRAM elementary memory cell, a corresponding reading of the control datum, and an inversion or not of the datum read from the SRAM elementary memory cell will occur according to the read value of the control datum.

The control memory cell functionally analogous to the at least one memory cell is a memory cell which, while being able to have a structure different from that of the memory cell, is also configured to carry out a datum value inversion in a reloading of its SRAM elementary memory cell with a datum previously written into its associated non-volatile elementary memory cell(s).

According to one embodiment, the method furthermore comprises, in the first writing of a datum into the SRAM elementary memory cell of the at least one memory cell, following an odd number of reloading(s) of the SRAM elementary memory cell since the last writing into the SRAM elementary memory cell. A writing of the control datum has a first value, for example the logical value "0", into the SRAM elementary memory cell of the control memory cell. If, in the reading, the read value of the control datum is equal to a second value, different from the first value, for example the logical value "1", an inversion of the value of the datum of the SRAM elementary memory cell of the at least one memory cell and a delivery of each inverted datum. On the other hand, if the read value of the control datum is equal to the first value, a delivery of the datum actually read from the SRAM elementary memory cell of the at least one memory cell.

Thus, when the SRAM elementary memory cell of the memory cell is read, the SRAM elementary memory cell of the control memory cell is also read, and if the control datum, in this case one bit, has been inverted, this means not only that a non-volatile reloading of the SRAM elementary memory cell of the memory cell has taken place with datum inversion, but also that no writing of the SRAM elementary memory cell has since taken place, i.e., that the last operation having repositioned the SRAM cell into a given logic state is a reloading.

And, in this case, the actually read datum is inverted.

Conversely, if the control bit does not change value, this means that no non-volatile reloading of the SRAM memory cell has taken place and that this simply involves a reading of an SRAM cell during a conventional SRAM operation without prior non-volatile transfer. Therefore, there is no need to invert the actually read datum.

The granularity of the control memory cells depends on the envisaged application and/or the mode of operation of the SRAM elementary memory cells.

Thus, according to one embodiment, each SRAM word (eight bits for example) corresponding to a block of a plurality of memory cells (eight for example) can have an associated ninth cell which is the control memory cell.

More precisely, in an embodiment of this type, the set of memory cells includes a plurality of blocks of a plurality of memory cells (for example a plurality of blocks of eight memory cells) and a control memory cell is associated with each block of memory cells. In the first writing of a data block (a byte for example) into a block of SRAM elementary memory cells of the corresponding block of memory cells, following an odd number of reloading(s) of the block of SRAM elementary memory cells since the last writing into the block of SRAM elementary memory cells, the control datum having the first logical value is written into the SRAM elementary memory cell of the corresponding control memory cell.

In the event of a command to read the contents of each SRAM elementary memory cell of the block, the contents of the SRAM elementary memory cell of the corresponding control memory cell are read. If the read value of the control datum is equal to the second logical value, the value of the datum of each SRAM elementary memory cell of the block is inverted and each inverted datum is delivered. Whereas, if the read value of the control datum is equal to the first logical value, the datum actually read from each SRAM elementary memory cell of the block is delivered.

Thus, in the embodiment which has just been described, with an organization by words of n bits, the management of the inversion of the datum requires n+1 bits. In other words, n=8 provides 9 bits, with a loss in size of approximately 12%.

However, it is possible to gain space at the expense of a little more complexity by using a common control bit for p words, for example p bytes.

Thus, for example, following a non-volatile reloading, this control bit, initially at 0, is inverted and read at "1" and the data of the p bytes are inverted to recover the correct data. And, subsequently, in the case of SRAM writing of at least one word (one byte for example) out of the p words, this control bit will be reset to 0, but the data of the p−1 other words will have to be read and reloaded in the opposite state. Thus, any subsequent SRAM reading of one of the p words will be carried out with the initial non-inverted data.

Thus, according to a different embodiment in which the set includes a plurality of subsets of a plurality of blocks (for example p blocs) of a plurality of memory cells (each block includes, for example, eight memory cells), a control memory cell is associated with each subset of blocks of memory cells. In the first writing of at least one data block into at least one block of SRAM elementary memory cells of a subset of memory cells, following an odd number of reloading(s) of the subset of SRAM elementary memory cells since the last writing into at least one block of SRAM elementary memory cells of this subset, the control datum having the first logical value is written into the SRAM cell of the corresponding control memory cell, and the data of the other SRAM elementary memory cells of the other blocks of the subset are read and the read but inverted data are overwritten into these other SRAM elementary memory cells of the other blocks.

In the event of a command to read the contents of each SRAM elementary memory cell of the subset, the contents of the SRAM cell of the control memory cell are read. If the read value of the control datum is equal to the second logical value, the value of the datum of each SRAM elementary memory cell of the subset is inverted and each inverted datum is delivered. Whereas, if the read value of the control datum is equal to the first logical value, the datum actually read from each SRAM elementary memory cell of the subset is delivered.

Regardless of the embodiment, if an even number of reloadings of an SRAM elementary memory cell has occurred since the last writing into this elementary memory cell (because, for example, during this period, all of the memory plane has been reloaded an even number of times and no writing has been carried out into this cell, whereas write operations have been carried out into other SRAM cells of the memory plane associated with other control bits), the control bit associated with this cell has then been inverted an even number of times and has reverted to its first logical value ("0" in this case) and the datum of the SRAM elementary memory cell has also been inverted an even number of times, which corresponds to its initial value.

In such a situation, it is not therefore necessary, albeit possible in some cases, in a first writing of a datum into the SRAM memory cell, following an even number of reloadings, to overwrite the control bit to "0" and it suffices simply to write the datum into the SRAM cell.

Regardless of the embodiment, a simple solution for detecting a first writing following an odd number of reloading(s) since a last writing may include a test of the value of the control datum.

More precisely, according to one embodiment, the first writing of the datum further includes, prior to the writing of the control datum having the first value into the SRAM elementary memory cell of the corresponding control memory cell, a reading of the value of the control datum from the SRAM elementary memory cell of the corresponding control memory cell. A read value of the control datum is equal to the second value to indicate that the writing of a datum into the SRAM elementary memory cell of a memory cell is indeed a first writing following an odd number of reloading(s) since the last writing into the SRAM elementary memory cell.

This is particularly significant when the set includes a plurality of subsets of a plurality of blocks (for example p blocs) of a plurality of memory cells (each block includes, for example, eight memory cells) and a control memory cell is associated with each subset of blocks of memory cells.

In fact, in this case, in the event of each command to write at least one data block into at least one block of SRAM elementary memory cells of a subset of memory cells, the method advantageously includes a reading of the corresponding control datum. If this control datum has the second value (in this case the logical value "1"), a writing of the data block into the at least one block of SRAM elementary memory cells of the subset of memory cells, a writing of the control datum having the first value into the SRAM elementary memory cell of the corresponding control memory cell, a reading of the data of the other SRAM elementary memory cells of the other blocks of the subset, and an overwriting of the read but inverted data into these other SRAM elementary memory cells of the other blocks. Whereas, if this control datum already has the first value (in this case the logical value "0"), a writing of the data block into the at least one block of SRAM elementary memory cells of the subset of memory cells.

By way of a non-limiting example, if the first logical value of the control datum is a "0", the reading of the datum may then include an application of an EXCLUSIVE OR logical function to the datum read from each SRAM elementary memory cell and to the control datum read from the SRAM elementary memory cell of the associated control memory cell.

According to a different aspect, a memory device is proposed. A set of at least one memory cell of the type comprises an SRAM elementary memory cell and a non-volatile elementary memory cell (or more than one non-volatile elementary memory cells) coupled to one another. The memory cell is configured to carry out a datum value inversion in a reloading into the SRAM cell of a datum previously written into the at least one non-volatile elementary cell. A control memory cell functionally analogous to the at least one memory cell is associated with the memory cell.

A first processing circuit is configured, with each transfer of a datum from the SRAM elementary memory cell into the at least one non-volatile elementary memory cell of the at least one memory cell and with each reloading of the SRAM elementary memory cell of the at least one memory cell, to perform respectively the same operations on a control datum of the control memory cell. A second processing circuit is configured, with each reading of a datum from the SRAM elementary memory cell, to carry out a corresponding reading of the control datum and an inversion or not of the datum read from the SRAM elementary memory cell according to the read value of the control datum.

According to one embodiment, the device further includes third processing circuit configured, in the first writing of a datum into the SRAM elementary memory cell of the at least one memory cell, following an odd number of reloading(s) of the SRAM elementary memory cell since the last writing into the SRAM elementary memory cell, to write the control datum having a first value into the SRAM elementary memory cell of the control memory cell. The second processing circuit is configured, in the event of a command to read the contents of the SRAM elementary memory cell of the at least one memory cell, to read the contents of the SRAM cell of the control memory cell. If the read value of the control datum is equal to a second value different from the first, the second processing circuit is configured to invert the value of the datum of the SRAM elementary memory cell of the at least one memory cell and deliver each inverted datum, while if the read value of the control datum is equal to the first value, the second processing circuit is configured to deliver the datum actually read from the SRAM elementary memory cell of the at least one memory cell.

According to one embodiment, the set includes a plurality of blocks of a plurality of memory cells, and a control memory cell is associated with each block of memory cells.

The device also comprises a third processing circuit configured, in the first writing of a data block into a block of SRAM elementary memory cells of the corresponding block of memory cells, following an odd number of reloading(s) of the block of SRAM elementary memory cells since the last writing into the block of SRAM elementary memory cells, to write the control datum having the first logical value into the SRAM cell of the corresponding control memory cell. The second processing circuit is configured, in the event of a command to read the contents of each SRAM elementary memory cell of the block, to read the contents of the SRAM cell of the corresponding control memory cell. If the read value of the control datum is equal to the second logical value, the second processing circuit is configured to invert the value of the datum of each SRAM elementary memory cell of the block and deliver each inverted datum, whereas, if the read value of the control datum is equal to the first logical value, the second processing circuit is configured to deliver the datum actually read from each SRAM elementary memory cell of the block.

According to one embodiment, the third processing circuit is configured, prior to the writing of the control datum having the first value into the SRAM elementary memory cell of the corresponding control memory cell, to read the value of the control datum from the SRAM elementary memory cell of the corresponding control memory cell, a read value of the control datum equal to the second value indicating that the writing of a datum into the SRAM elementary memory cell of a memory cell is indeed a first writing following an odd number of reloading(s) since the last writing into the SRAM elementary memory cell.

According to one embodiment, the set includes a plurality of subsets of a plurality of blocks of a plurality of memory cells, and a control memory cell is associated with each subset of blocks of memory cells. The device furthermore includes a third processing circuit configured, in the first writing of at least one data block into at least one block of SRAM elementary memory cells of a subset of memory cells, following an odd number of reloading(s) of the subset of SRAM elementary memory cells since the last writing into at least one block (not necessarily the same) of SRAM elementary memory cells of this subset, to write the control datum having the first logical value into the SRAM cell of the corresponding control memory cell, to read the data contained in the other SRAM elementary memory cells of the other blocks of the subset and to overwrite the read but inverted data into these other SRAM elementary memory cells.

In this embodiment, the second processing circuit is configured, in the event of a command to read the contents of each SRAM elementary memory cell of the subset, to read the contents of the SRAM cell of the control memory cell. If the read value of the control datum is equal to the second logical value, the second processing circuit is configured to invert the value of the datum of each SRAM elementary memory cell of the subset and deliver each inverted datum, whereas, if the read value of the control datum is equal to the first logical value, the second processing circuit is configured to deliver the datum actually read from each SRAM elementary memory cell of the subset.

According to one embodiment, the third processing circuit is configured, in the event of each command to write at least one data block into at least one block of SRAM elementary memory cells of a subset of memory cells, to read the corresponding control datum. If this control datum has the second value, the third processing circuit is configured to write the data block into the at least one block of SRAM elementary memory cells of the subset of memory cells, to write the control datum having the first value into the SRAM elementary memory cell of the corresponding control memory cell, to read the data from the other SRAM elementary memory cells of the other blocks of the subset, and to overwrite the read but inverted data into these other SRAM elementary memory cells of the other blocks. Whereas, if this control datum already has the first value, the third processing circuit is configured to write the data block into the at least one block of SRAM elementary memory cells of the subset of memory cells.

According to one embodiment, the first logical value is a 0 and the second processing circuit includes, for each SRAM elementary memory cell of each memory cell, an EXCLUSIVE OR logical operator configured to receive at the input the datum read from the SRAM elementary memory cell and the control datum read from the SRAM elementary memory cell of the associated control memory cell.

By way of example, the SRAM elementary memory cell of the memory cell comprises two inverters cross-coupled to one another. The one memory cell includes a single non-volatile elementary memory cell comprising a floating-gate transistor connected between a power supply terminal and a first output of the two inverters, and an interconnect transistor connected in series between the power supply terminal and the floating-gate transistor or between the floating-gate transistor and the first output of the two inverters.

According to a different possible example, the at least one memory cell comprises at least two non-volatile elementary memory cells, each having a floating-gate transistor, the floating-gate transistors having first conduction electrodes connected to a power supply terminal and second conduction electrodes respectively connected to two outputs of the two inverters via two interconnect transistors.

Each non-volatile elementary memory cell may be of the EEPROM type.

According to a different aspect, an integrated circuit includes a memory device as defined above.

BRIEF DESCRIPTION OF THE DRAWINGS

Other advantages and characteristics of the invention will become evident from the detailed description of embodiments, which are in no way limiting, and the attached drawings, in which:

FIGS. 1 to 11 relate to different embodiments of the invention.

DETAILED DESCRIPTION OF ILLUSTRATIVE EMBODIMENTS

Figure 1:
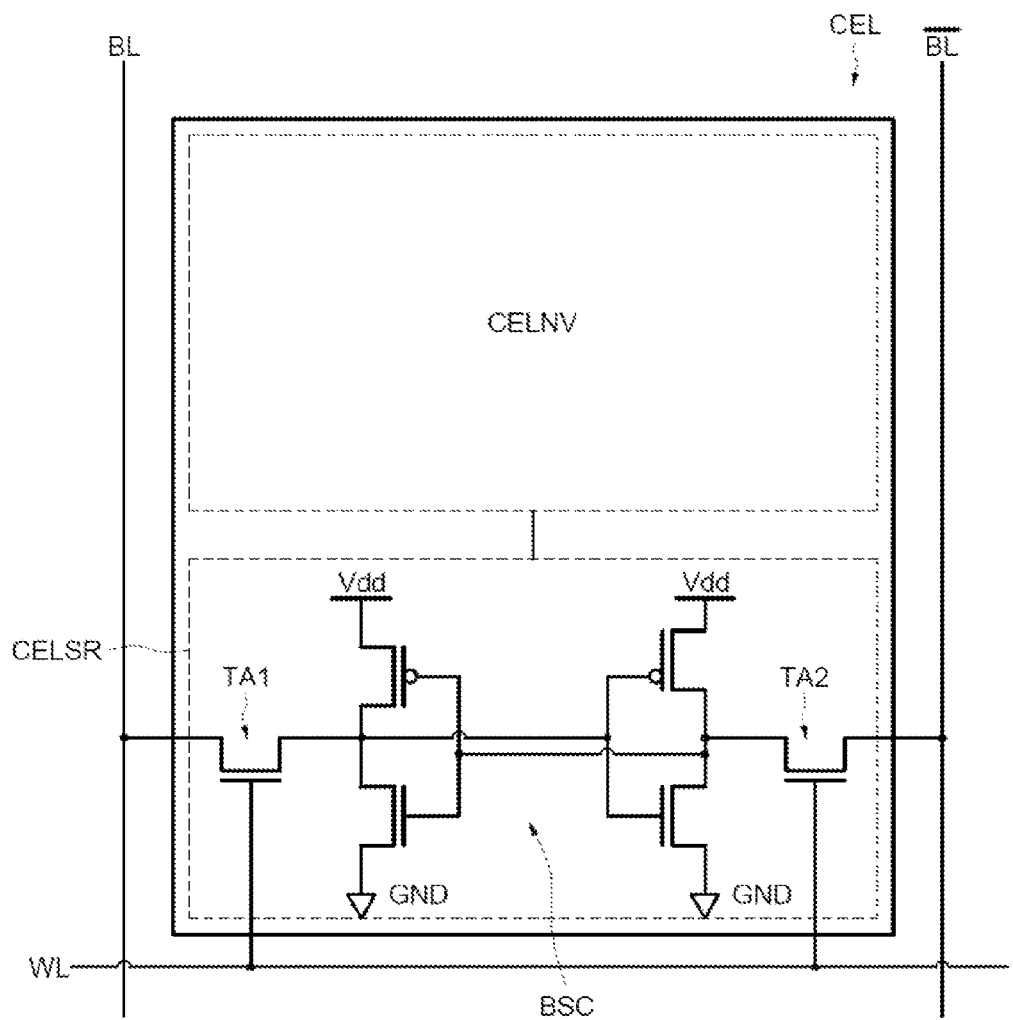

In FIG. 1, the reference CEL denotes a memory cell of the memory plane, comprising an SRAM elementary memory cell CELSR and at least one non-volatile elementary memory cell CELNV. These two elementary memory cells are coupled to one another.

The elementary memory cell CELSR has a conventional structure and includes a bistable circuit BSC formed from two cross-coupled inverters CMOS. The circuit also includes two access transistors TA1 and TA2. The two inverters are connected between a power supply terminal intended to be connected to the supply voltage Vdd and to the ground GND.

The two access transistors TA1 and TA2 are connected between the outputs of the two inverters and two lines of bits BL and $\overline{BL}$ respectively, where $\overline{BL}$ denotes the supplementary line of bits of the line BL. The gates of the access transistors TA1 and TA2 are connected to a line of words WL.

In non-volatile operation, the writing and reading of a datum into and from the elementary memory cell CELSR are conventional operations known per se. Moreover, in this non-volatile operation, a datum written into the cell CELSR is read without being inverted.

Conversely, in the event of a loss of power or in response to an external command, the datum contained in the elementary memory cell CELSR is transferred to and stored in the non-volatile elementary memory cell CELNV. Then, when power is restored, the elementary memory cell CELSR is reloaded with the contents of the non-volatile elementary memory cell CELNV.

And, the memory cell CEL is configured here, in this operation of reloading of the cell CELSR, to invert the datum in relation to the datum initially stored in the memory cell CELSR before the non-volatile transfer to the non-volatile elementary memory cell CELNV.

As indicated above, examples of such memory cells CEL carrying out an inversion of the datum in the reloading of the cell CELSR are well known.

The management of this data inversion is carried out here by associating (FIGS. 2 and 3) a control memory cell CELT, functionally analogous to the memory cell CEL, with each memory cell CEL. This control memory cell CELT is, therefore, also configured to invert the datum in a reloading of its elementary memory cell CELSRT from its non-volatile memory cell CELNVT. In practice, the control memory cell is also structurally analogous to the memory cell CEL, although this is not absolutely essential.

Figure 3:
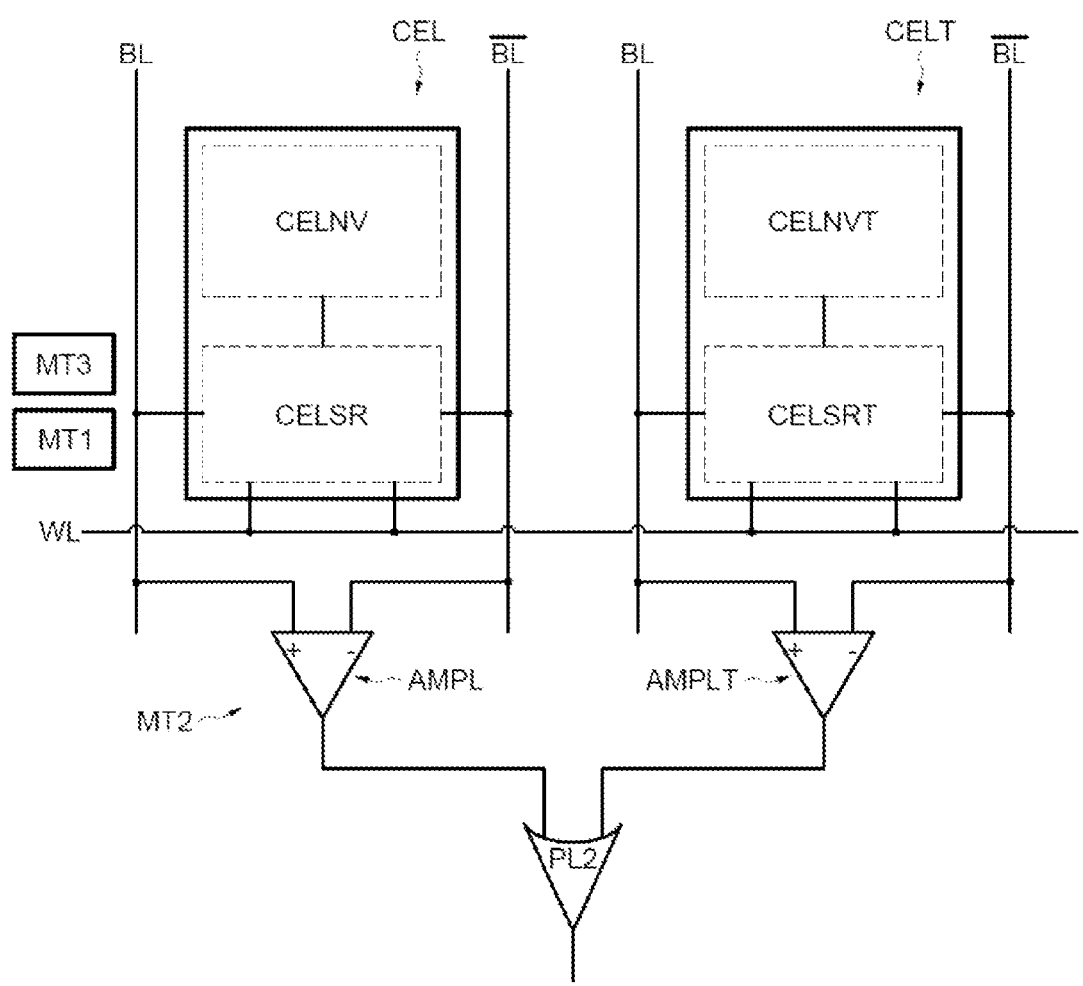

In FIG. 3, the reference MT1 denotes a first processing circuit that is configured, with each transfer of a datum from the SRAM elementary memory cell CELSR into the non-volatile elementary memory cell CELNV, and, with each reloading of the SRAM elementary memory cell CELSR, to carry out respectively the same operations on a control datum, in this case one bit, of the control memory cell CELT.

The circuit MT1 comprises a conventional circuit for writing into a non-volatile memory and a conventional circuit for transferring a datum from a non-volatile memory to an SRAM memory, the circuit being used in memories having a structure of this type.

The reference MT2 denotes a second processing circuit configured, with each reading of a datum from the SRAM elementary memory cell CELSR, to carry out a corresponding reading of the control datum, and an inversion or not of the datum read from the SRAM elementary memory cell CELSR according to the read value of the control datum. An example of the structure of the circuit MT2 will be examined in more detail below.

Generally, in the first writing of a datum into the SRAM elementary memory cell CELSR of the memory cell CEL, following an odd number of reloading(s) of the SRAM elementary memory cell CELSR since the last writing into this memory cell CELSR, the control datum having a first value, for example the logical value "0", is written into the SRAM elementary memory cell CELSRT of the control memory cell CELT. If, in the reading, the read value of the control datum is equal to a second value, different from the first value, for example the logical value "1", the value of the datum of the SRAM elementary memory cell CELSR of the memory cell is then inverted and the inverted datum is delivered. Whereas, if the read value of the control datum is equal to the first logical value, the datum actually read from the SRAM elementary memory cell CELSR is then delivered.

In practice, one method for determining whether a writing into the SRAM cell CELSR is a first writing following an odd number of reloading(s) of this cell CELSR since the last writing into this memory cell CELSR consists in reading the value of the control datum and checking whether it has the second logical value "1".

In fact, as indicated above, a reloading of the SRAM cell CELSRT following a non-volatile transfer inverts the contents of this cell CELSRT.

Figure 2:
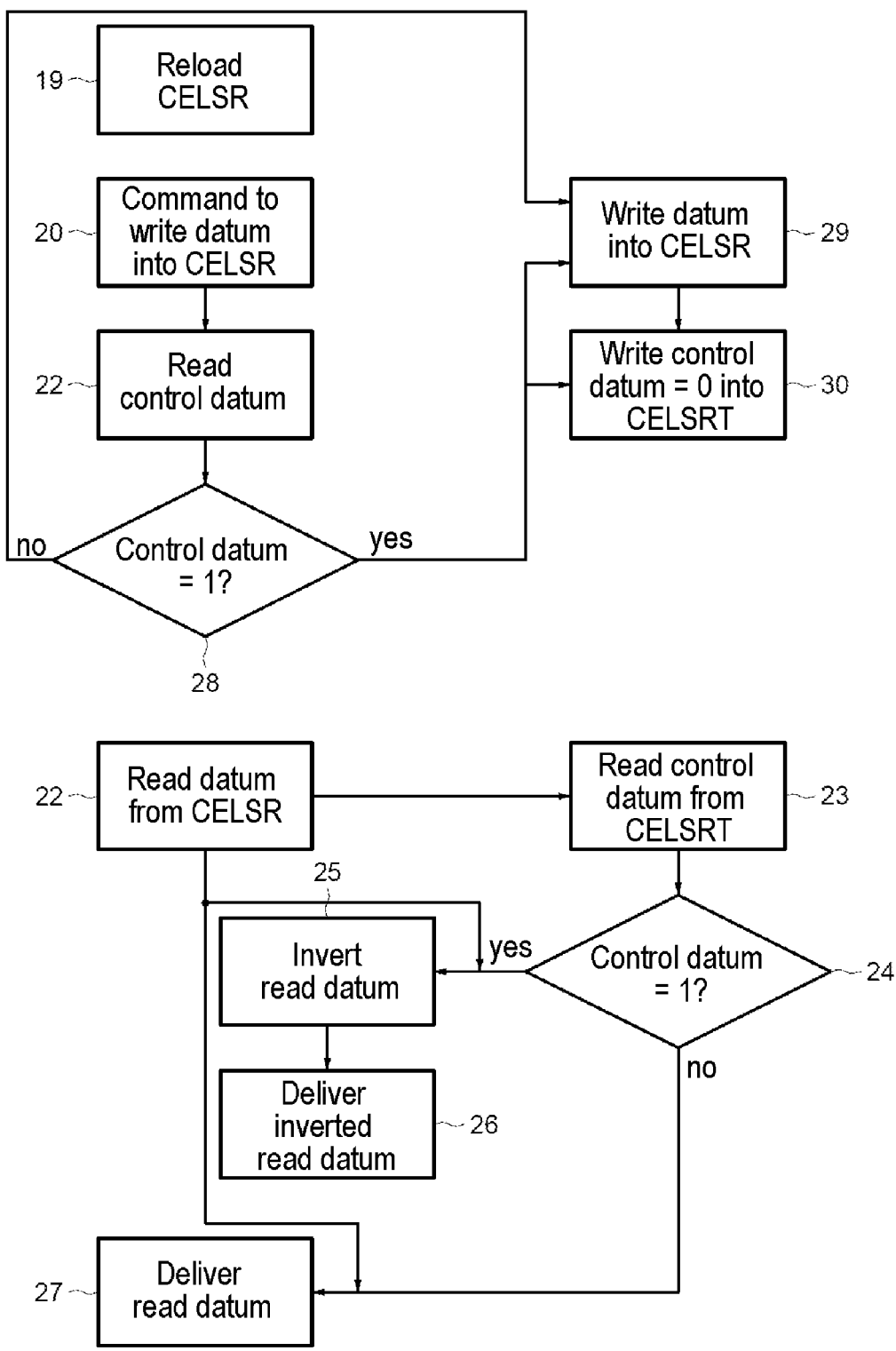

More precisely, as shown in FIG. 2, in the event of a command to write 20 a datum, in this case 1 bit, into the elementary memory cell CELSR of the memory cell CEL, regardless of whether this write command does or does not follow a reloading 19 of the elementary memory cell CELSR, the control datum is read (step 21) and a check is carried out (step 28) to ascertain whether this control datum has the same logical value "1".

If so, which means that this writing into the SRAM cell CELSR will be the first following an odd number of reloading(s) of this cell CELSR since the last writing into this memory cell CELSR, not only is the datum written into the cell CELSR (step 29), but also the control datum is written into the elementary memory cell CELSRT of the control memory cell CELT (step 30) by assigning the logical value "0" to it.

Conversely, if the control datum already had the logic value "0" in step 28, the only action performed is to write the datum into the cell CELSR (step 29). This corresponds to the case where there is an even number of volatile reloadings of the memory plane during a period, with writings into other cells of the memory plane during this period, but no writing into this cell CELSR concerned.

Subsequently, in a reading 22 of the datum contained in the elementary memory cell CELSR, the control bit stored in the elementary memory cell CELSRT is also read (step 23).

The logical value of this control bit is then checked (step 24).

If the control bit has been inverted, e.g., if in this case, it has the logical value 1, this then means that a non-volatile transfer of the data contained in the elementary memory cells CELSR and CELSRT has taken place from the cells CEL and CELT to the corresponding non-volatile memory cells CELNV and CELNVT followed by a reloading of these cells CELSR and CELSRT.

In this case, the datum read from the elementary memory cell CELSR is inverted (step 25), since the datum was inverted during the reloading, and the inverted read datum, which corresponds to the datum initially stored in the memory cell CELSR before non-volatile transfer to the elementary memory cell CELNV, is therefore delivered (step 26).

If the control bit has not been inverted, e.g., if it keeps its logical value 0, this then means that there has been no odd-numbered non-volatile reloading, and that a simple SRAM reading during a conventional SRAM operation is involved here. The datum actually read from the elementary memory cell CELSR is therefore delivered (step 27).

Here (FIG. 3), the second processing circuit MT2 comprises a conventional circuit for reading an SRAM cell, typically read amplifiers AMPL and AMPLT connected to the lines of bits BL and the supplementary lines of bits $\overline{BL}$ of the two cells CEL and CELT respectively.

Moreover, since the first logical value of the control bit is equal to 0, and, consequently, this logical value is equal to 1 in the event of data inversion, the second processing circuit MT2 also comprises an EXCLUSIVE OR logical operator PL2 receiving at its input the outputs of the two read amplifiers AMPL and AMPLT.

Thus, when the control bit is equal to 0, the datum delivered by the read amplifier AMPL is not inverted at the output of the gate PL2, whereas it is inverted at the output of the gate PL2 if the value of the control bit delivered by the amplifier AMPLT has the logical value 1. Thus, in all cases, a datum which is non-inverted in relation to the datum initially written into the cell CELSR is delivered at the output of the gate PL2.

The third processing circuit is configured here to carry out steps 20, 21, 28 and 29 shown in FIG. 2. Therefore, this circuit comprises a conventional circuit for writing and reading into and from an SRAM cell and a logic circuitry, for example, to test the value of the control bit and consequently to control the writing into the cell CELSR and possibly into the cell CELSRT.

While the embodiment that has just been described, the writing of the control bit at 0 into the cell CELSRT, is carried out once only during the first writing of a datum into the cell CELSR following an odd number of reloading(s) of this cell CELSR since the last writing into this cell CELSR, it should be noted that it would be possible, as an alternative, to write the control bit at 0 into the cell CELSRT with each writing of a datum into the cell CELSR.

The embodiment providing the single writing of the control bit consumes less power but requires the provision of an additional logic circuit within the third processing circuit MT3 to inhibit the writing of the control bit into the cell CELSRT during the writings into the cell CELSR following the first writing.

Conversely, the alternative mentioned above consumes more power but results in a simpler implementation of the circuit MT3.

In other embodiments that will now be described, the solution can be adopted to involve the writing of the control bit at 0 only during a first writing into a cell CELSR following an odd number of reloading(s) of this cell CELSR since the last writing into this cell CELSR, even if the alternative mentioned above could also be applied. In the embodiment shown in FIGS. 4 and 5, a control memory cell CELT is associated with each block of memory cells CEL1-CEL8. In this example, each block comprises eight memory cells. And, data blocks, here bytes, are written into the blocks of elementary memory cells CELSR1-CELSR8.

Figure 4:
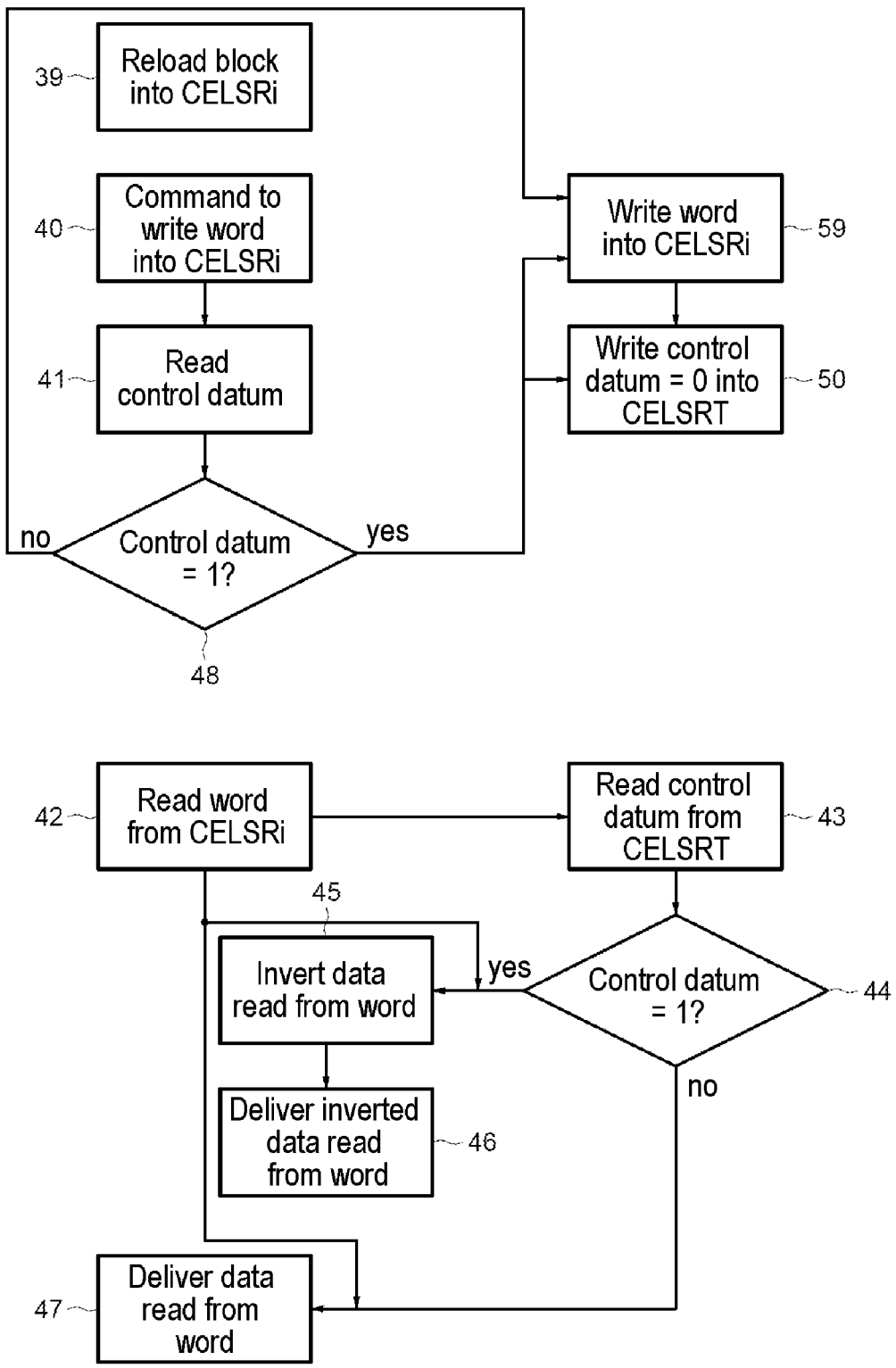

And, as shown in FIG. 4, in the event of a command to write 40 a data byte into the cells CELSRi of the block of cells, whether or not following a reloading 39 of the block of cells CELSRi, the control datum is read (step 41) and a check is carried out (step 48) to ascertain whether this control datum has the second logical value "1".

If so, which means that this writing into the block of SRAM cells CELSRi will be the first after an odd number of reloading(s) of this block of SRAM cells CELSRi, not only is the data byte written into the block of cells CELSRi (step 49), but also the control bit with the value "0" is written into the SRAM elementary memory cell CELSRT of the control memory cell CELT (step 50).

Conversely, if the control datum already had the logical value "0" in step 48, the only action performed is to write the byte into the block of cells CELSRi (step 49).

Subsequently, in the reading 42 of a byte into the elementary memory cells CELSR1-CELSR8, the control bit contained in the elementary memory cell CELSRT is also read (step 43). Here also, the inversion or not of the control bit is checked, e.g., whether or not the control has the logical value 1 (step 44). In the case of inversion of the value of the control bit, the read data of the byte which were contained in the elementary memory cells CELSR1-CELSR8 are inverted (step 45) and the inverted byte is delivered (step 46).

In the opposite case, the byte as read from the elementary memory cells CELSR1-CELSR8 is delivered.

Figure 5:
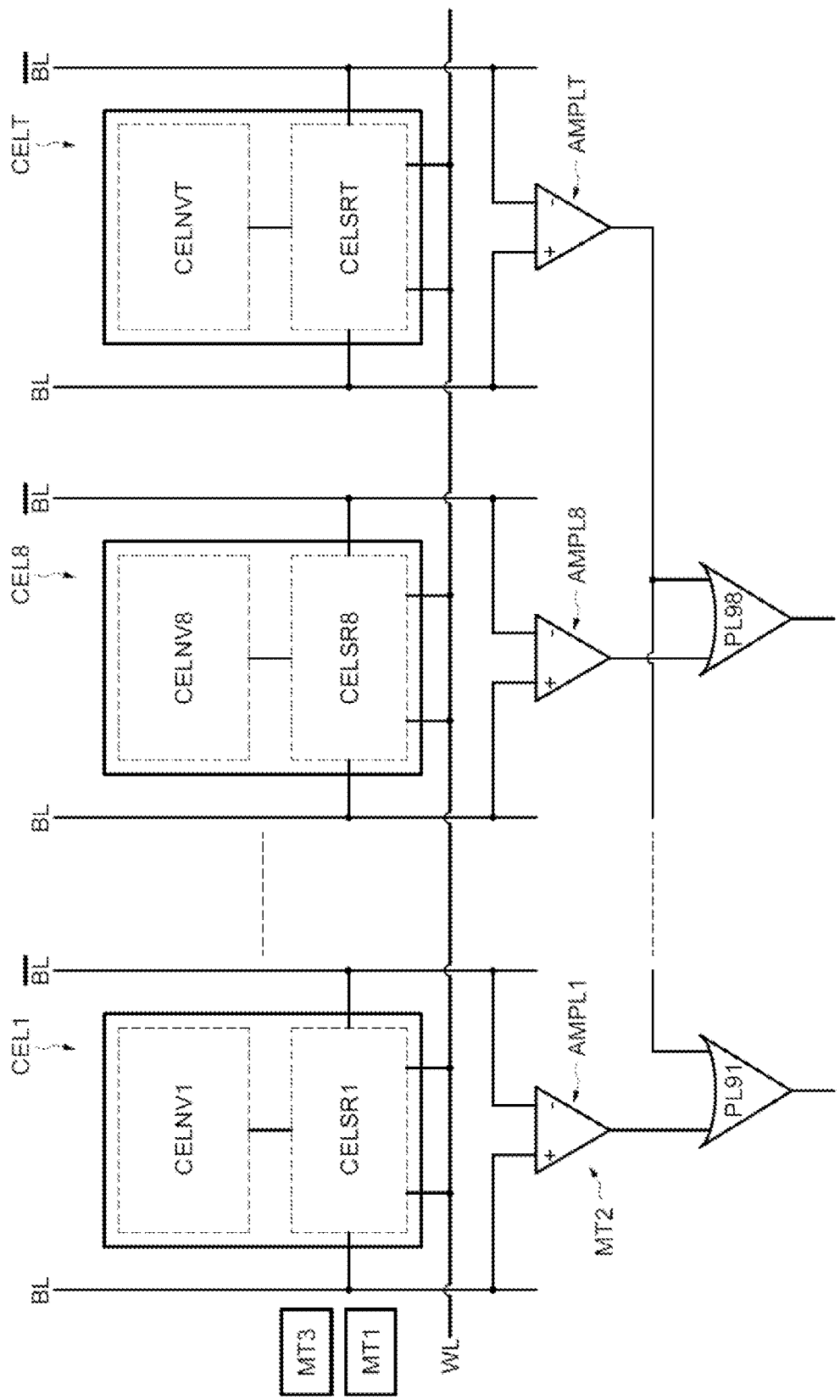

In this respect, as shown in FIG. 5, the circuit MT2 in this embodiment comprises eight two-input EXCLUSIVE OR logic gates PL91-PL98. Each logic gate PL9i is connected to the output of the corresponding read amplifier AMPLi connected to the memory cell CELi and to the output of the read amplifier AMPLT connected to the control memory cell CELT.

The third circuit MT3 is configured to carry out the steps 40, 41, 48, 49 and 50. This circuit can have, for example, a structure similar to the circuit MT3 shown in FIG. 3.

Figure 6:
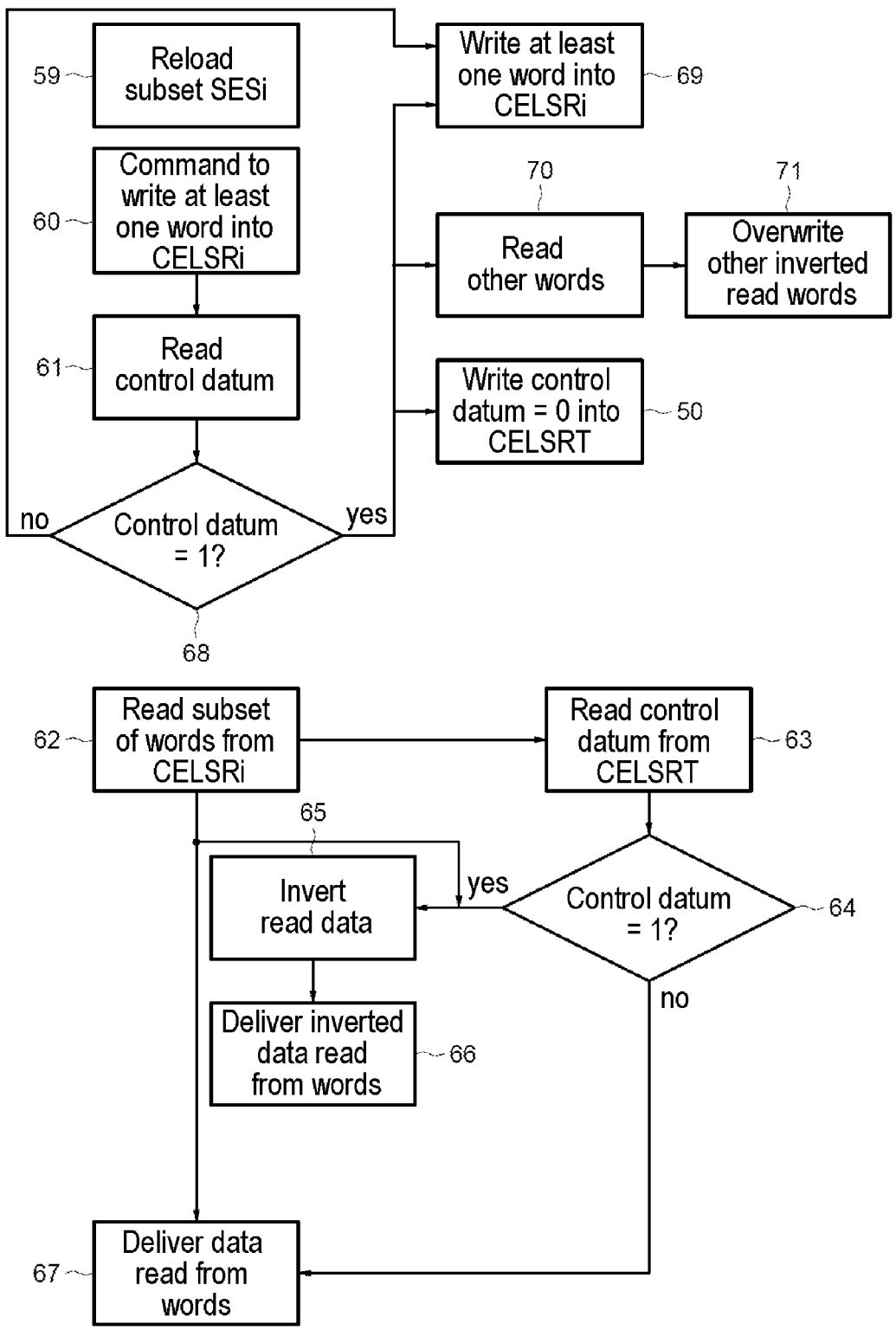
Figure 7:
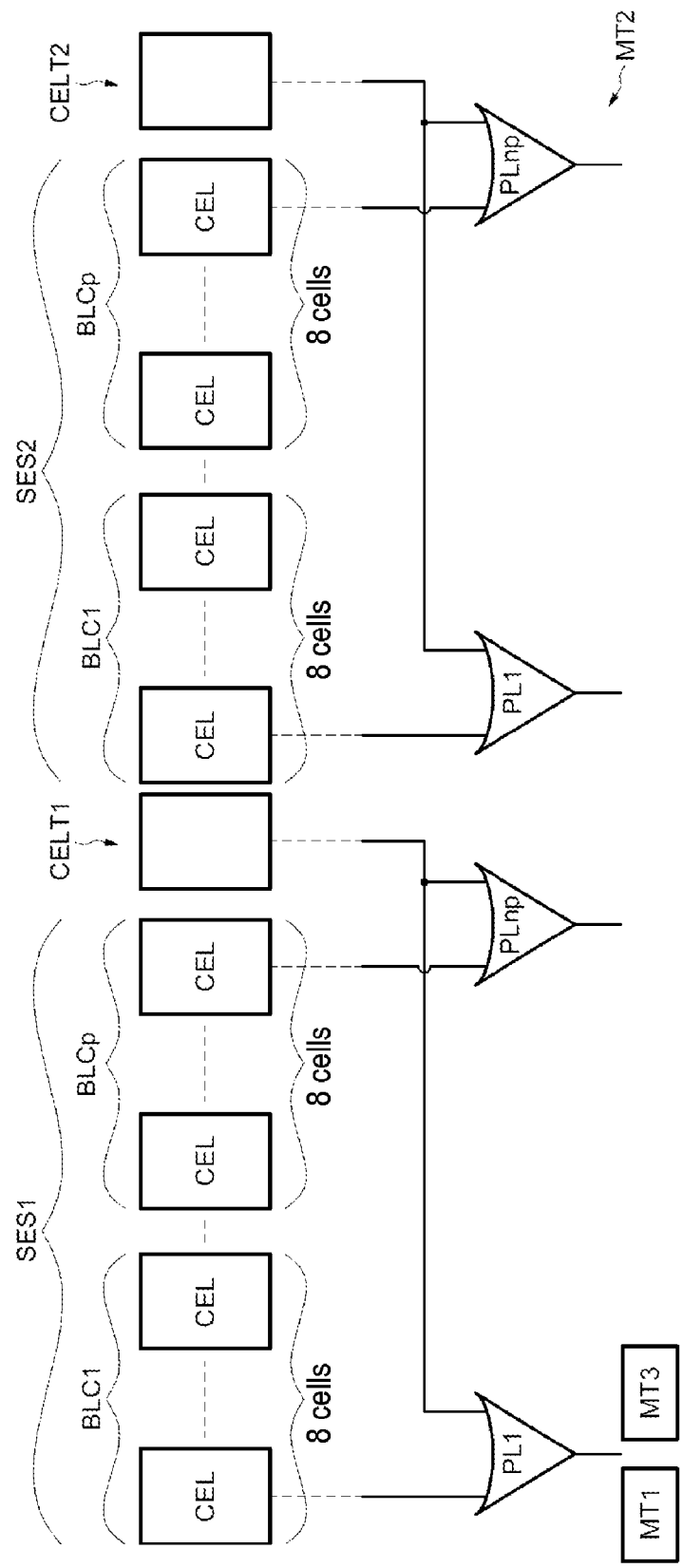

In order to gain space on the silicon, a control memory cell can, as illustrated in the embodiments shown in FIGS. 6 and 7, be associated with each subset containing p blocks of a plurality of cells.

Thus, by way of example, as shown in FIG. 7, each subset SES1, SES2, ... contains p blocs BLC1-BLCp, each block comprising a plurality of cells, here eight cells.

Thus, as shown in FIG. 6, in the event of a command to write (step 60) a byte into at least one block BLCi of a subset SES1, for example, whether or not following the reloading 59 of all the cells CELSRi of this subset, the corresponding control datum is read (step 61) and a check is carried out (step 68) to ascertain whether this control datum has the second logical value "1".

If so, which means that this writing of the byte into the SRAM cells CELSRi of the block BLCi will be the first after an odd number of reloading(s) 59 since the last writing of at least one byte into the SRAM cell of at least one of the blocks BLCi, not only is the data byte written (step 69) into the block of cells CELSRi, but also (step 72) the control datum with the logical value "0" is written in the SRAM elementary memory cell of this control cell CELT1.

And a reading of the bytes contained in the p−1 other blocks of the subset is furthermore carried out (step 70), then an overwriting 71 of these inverted bytes into these p−1 other blocks of the subset SES1.

Thus, in a subsequent SRAM reading with no prior non-volatile transfer (corresponding therefore to a non-inverted control bit) the p−1 bytes contained in these p−1 other blocks will have been inverted twice (a first time in the non-volatile reloading and a second time in step 71) so that these data will correspond to the data initially stored in the corresponding SRAM elementary memories.

The reading of the p−1 other bytes and the overwriting of the inverted data can be carried out in series, byte-by-byte, or in parallel according to the best selected architecture compromise.

Conversely, if the control datum already had the logical value "0" in step 68, the only action performed is to write the byte into the block of cells CELSRi (step 69) without carrying out the steps 70 and 71.

Subsequently, when all the bytes of all the blocks of the corresponding subset (SES1 for example) are read (step 62), the control datum (control bit) contained in the cell CELSRT is also read (step 63).

Here also, the inversion or not of this control bit is checked (step 64), e.g., whether or not the control bit has the logical value 1.

If the control bit is inverted, all the read octets are inverted (step 65) and the inverted read bytes are delivered (step 66). In the opposite case, the actually read bytes are delivered (step 67).

This time, as shown in FIG. 7, the circuit MT2 comprises, for each subset SES1 and the associated control memory cell CELT1, n times p EXCLUSIVE OR logic gates PL911 having 2 inputs, where n denotes the number of memory cells of each of the p blocks. Here also, one of the inputs of a logic gate PLi is connected to the output of the read amplifier of the corresponding cell CELi and the other input of this logic gate is connected to the output of the read amplifier of the corresponding control cell CELTi.

The third processing circuit MT3 is configured to carry out the steps 60, 61, 68, 69 and 70-72. The circuit MT3 also has, for example, a structure similar to the circuit MT3 shown in FIG. 3. The logic circuitry can test the value of the control bit to control the appropriate write/overwrite and/or readings.

In all of the preceding description, it is supposed that the memory plane had been initialized with all the control bits at "0". However, it would have been possible to initialize the control bits at "1", but by storing data already inverted in relation to the initial data actually required in the SRAM cells CELSR.

Figure 8:
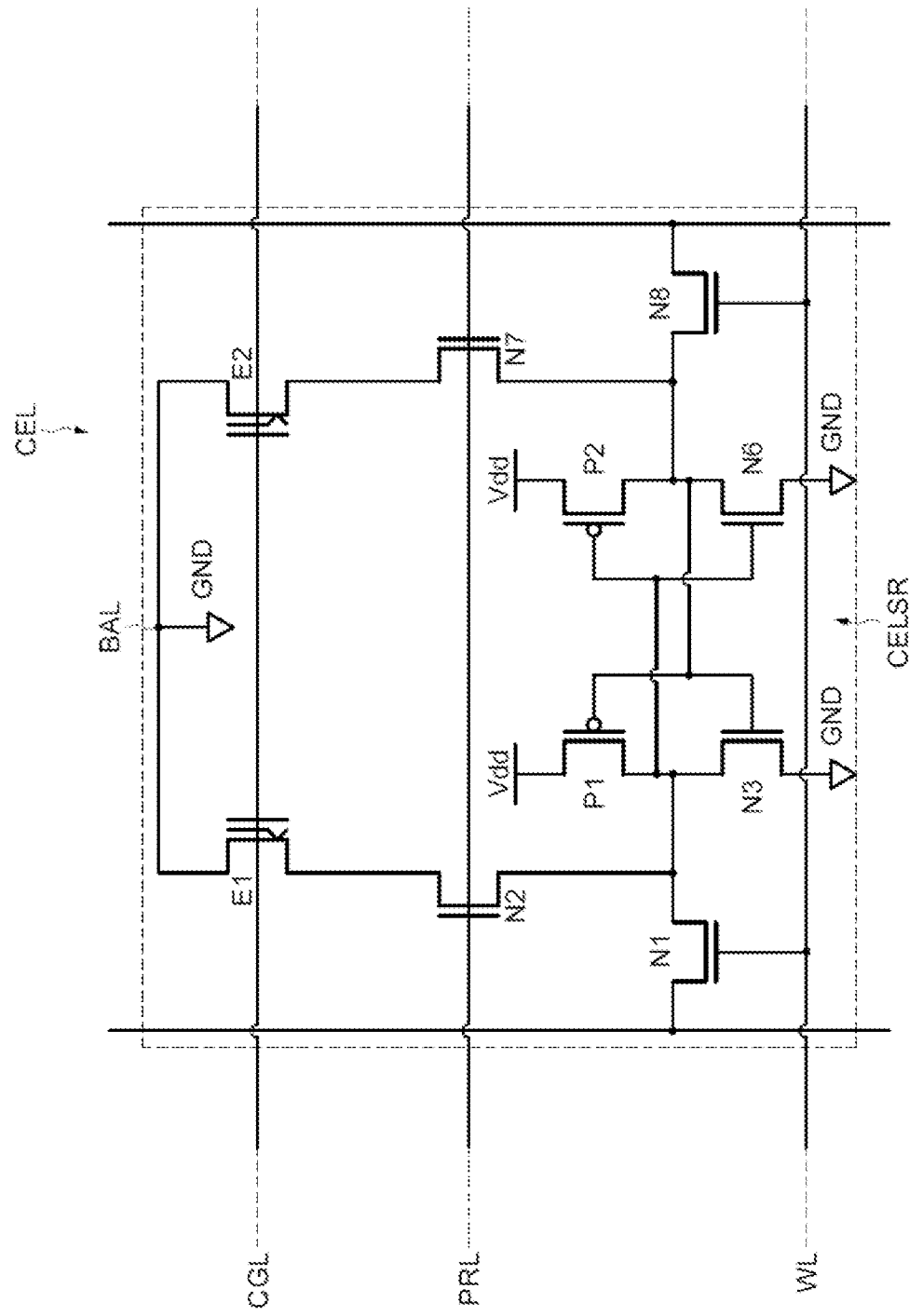

Reference is now made more particularly to FIG. 8 to illustrate an example embodiment of a memory cell CEL configured to carry out a data inversion in the reloading of the elementary memory cell CELSR from the non-volatile elementary memory cell. A cell of this type has already been described in the French patent application no. 1355439 (applicant docket 13-RO-0047), which is Incorporated herein by reference.

In FIG. 8, the memory cell CEL comprises the SRAM elementary memory cell CELSR and two non-volatile EEPROM elementary cells, here comprising two floating-gate transistors E1 and E2.

The non-volatile EEPROM cells of the cell CEL are conventional cells, e.g., from which the selection transistor has been removed and having a tunnel injection zone between the floating gate and the drain.

The sources of these two transistors E1 and E2 are connected to a power supply terminal BAL, which is connected here to ground. The control electrodes of the two floating-gate transistors E1 and E2 are for their part reconnected to a first control line CGL.

The elementary cell CELSR has a conventional structure and includes a first inverter comprising the transistor PMOS P1 and the NMOS transistor N3, and a second inverter comprising the transistor PMOS P2 and the NMOS transistor N6. These two inverters are connected between a different power supply terminal intended to be connected to the supply voltage Vdd and to ground.

These two inverters are cross-coupled, i.e., the input of the first inverter formed by the gates of the transistors P1 and N3 is connected to the output of the second inverter formed by the drains of the transistors N6 and P2, whereas the input of the second inverter, formed by the gates of the transistors P2 and N6, is connected to the output of the first inverter formed by the drains of the transistors P1 and N3.

The cell CELSR also comprises two NMOS access transistors, denoted N1 and N8, connected between the outputs of the two inverters and two lines of bits BL and $\overline{BL}$ respectively, where $\overline{BL}$ denotes the supplementary line of bits of the line BL. The gates of the access transistors N1 and N8 are connected to a line of words WL.

The drains of the two floating-gate transistors E1 and E2 are connected to the inputs and to the outputs of the two inverters by an interconnect stage, here comprising two NMOS interconnect transistors denoted N2 and N7.

More precisely, the two interconnect transistors N2 and N7 are connected between the drains of the two floating-gate transistors E1 and E2 and the two outputs of the two inverters P1, N3 and P2, N6 respectively. Furthermore, the control electrodes (gates) of these two interconnect transistors N2 and N7 are connected to a second control line PRL.

Figure 9:
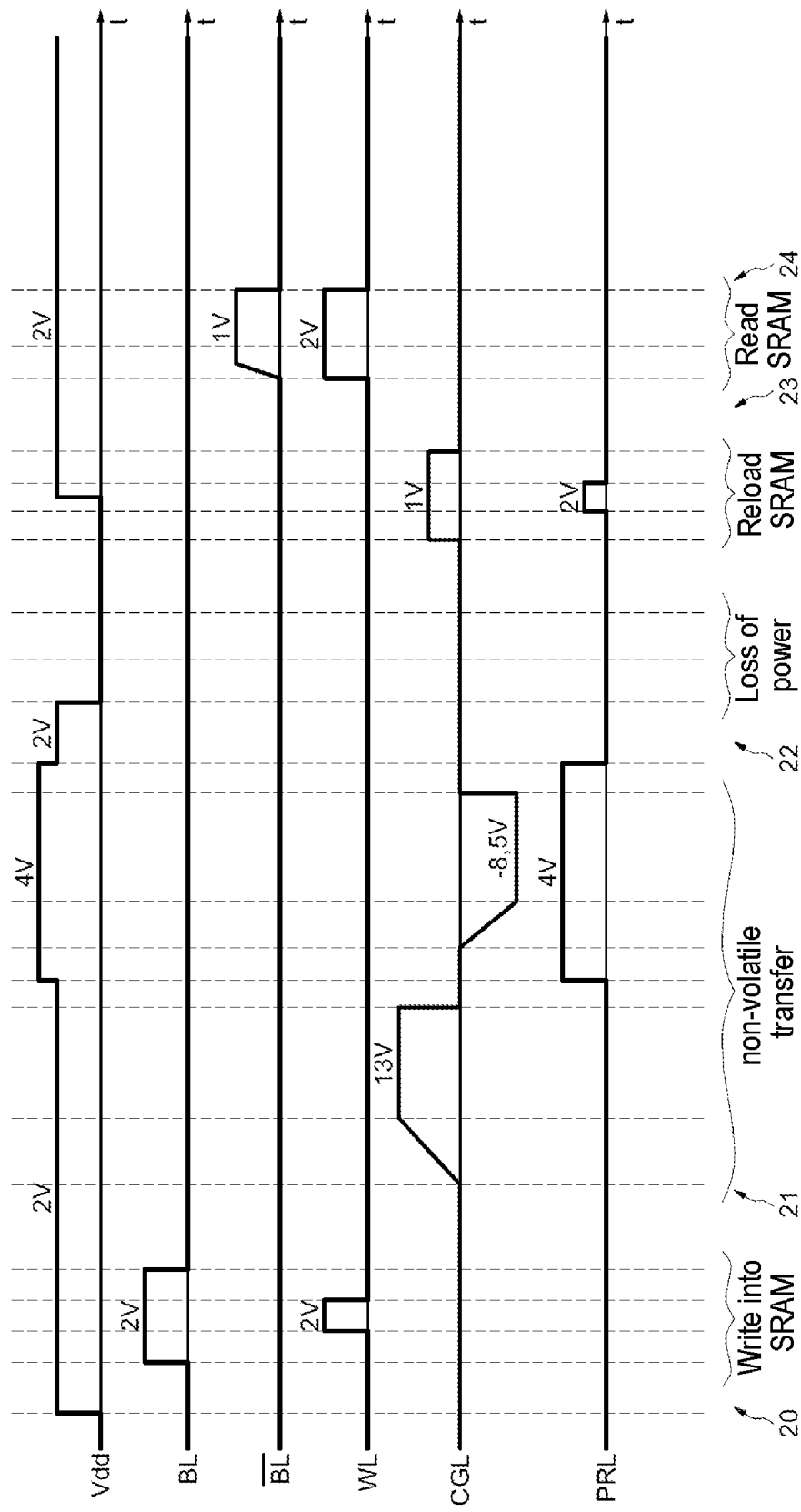

Reference is now made more particularly to FIG. 9 which is a temporal chronogram illustrating the different modes of operation of the memory cell CEL shown in FIG. 8.

The writing into the elementary memory cell CELSR, denoted 20 in the timing diagram of FIG. 9, is a conventional writing. More precisely, to write a "1", the line of bits BL is connected to the supply voltage Vdd (here two volts), whereas the supplementary line of bits $\overline{BL}$ is connected to ground and the line of words WL is connected to the supply voltage Vdd.

The control line PRL is connected to ground, thereby blocking the interconnect stage. Similarly, the first control line CGL is also connected to ground.

The drain of the transistor N6 and the gates of the transistors P1 and N3 are connected to ground via the transistor N8 which is in the ON state. A switchover of the latch formed by the two cross-coupled inverters then takes place through switching of the drain of the transistor N3 to Vdd and switching of the drain of the transistor N6 to ground.

When the cell is selected to write a "0" into the elementary cell CELSR, the line of bits BL is connected to ground, the supplementary line of bits $\overline{BL}$ is connected to the supply voltage Vdd and the line of words is also connected to the supply voltage Vdd.

The drain of the transistor N3 and the gate of the transistors P2 and N6 are drawn to ground by the transistor N1 which is in the ON state. A switchover of the latch takes place via the drain of the transistor N3 which switches to ground and the drain of the transistor N6 which switches to Vdd.

The datum is retained when the cell is deselected.

A transfer or non-volatile storage 21 of the content of the cell CELSR to the two non-volatile elementary memory cells E1 and E2 will now be described. In this respect, it is assumed that the cell CELSR is, for example, positioned to store a "1", i.e., that the source of the transistor N2 is connected to the supply voltage Vdd, whereas the source of the transistor N7 is connected to ground. The line of words WL is also connected to ground.

Obviously, all of the description that follows will have to be inverted if the SRAM cell is positioned to store a "0".

A transfer or non-volatile writing consists of an erase cycle followed by a differential programming cycle, since two non-volatile elementary memory cells are present.

For the erase cycle, the line PRL remains connected to ground, thereby blocking the interconnect transistors N2 and N7. An erase voltage is then sent on the first control line CGL. In the example described here, this erase voltage comprises a ramp then a plateau having a typical amplitude of 13 volts. The ramp-up can be effected typically in around 0.5 milliseconds, whereas the typical duration of the plateau is 1 millisecond.

Through coupling with the first control line CGL, the floating gates of the transistors E1 and E2 go up to around 9 volts, switching the non-volatile cells to the ON state and forcing the drain region to 0 volt.

The tunnel current discharges the floating gates of E1 and E2 to the drain region. Once the voltage on the first control line CGL has returned to idle (0 volt), a negative charge of around −1.5 volt is present on the floating gates of E1 and E2.

The two cells E1 and E2 are then erased.

The differential programming cycle is then effected as follows. The second control line PRL switches to the supply voltage Vdd that has switched here to 4 volts. Consequently, the interconnect transistors N2 and N7 are in the ON state. A programming voltage is then sent on the first control line CGL. This programming voltage is a negative voltage formed from a ramp then a plateau with a typical amplitude −8.5 volts. Here also, the duration of the ramp is typically 0.5 milliseconds, whereas the duration of the plateau is typically 1 millisecond.

The floating-gate transistors E1 and E2 are blocked, thus avoiding a short circuit to the power supply terminal BAL connected to ground, and without using additional isolation transistors which would be connected between the sources of the transistors E1 and E2 and the power supply terminal BAL.

The transistor N2 in the ON state transfers a voltage equal to Vdd minus the threshold voltage of the NMOS transistor to the drain of the transistor E1. The transistor N7 in the ON state transmits a voltage of 0 volt to the drain of the transistor E2.

The floating gate of the transistor E1, previously discharged to −1.5 volt, will drop towards −6.5 volts through capacitive coupling. The difference in potential across the injection zone of the transistor E1 is typically 9.5 volts. Consequently, the floating gate of the transistor E1 will be positively charged due to the tunnel effect.

The floating gate of the transistor E2, previously discharged to −1.5 volt, will drop towards −7.5 volts through capacitive coupling. The difference in potential across the injection zone of the transistor E2, typically in the region of 7.5 volts, is not enough to charge the floating gate of E2 due to the tunnel effect.

Once the voltage of the first control line CGL has returned to idle, e.g., at the end of the differential programming, the positive charge of 1.5 volts on the floating gate of E1 switches this cell to the ON state and to the written state, whereas the negative charge of −1.5 volts on the floating gate of E2 switches this cell to the blocked state, e.g., to the erased state.

It should be noted here that the erasure of the non-volatile cells is an unconditional erasure, whereas the programming is selective according to the value of the datum contained in the SRAM cell CELSR, e.g., according to the drain voltage of the non-volatile cell.

It is then assumed that a power loss 22 then a power-up take place. The reloading of the non-volatile data (i.e., the data contained in the non-volatile cells E1 and E2) into the SRAM cell CELSR will now be described.

For this reloading, the first control line CGL switches to a read reference voltage, typically 1 volt, whereas the second control line PRL has a voltage of 2 volts, for example in such a way as to switch the transistors N2 and N7 to the ON state.

The voltage of the line of words WL is zero.

The non-volatile cell E1, in the ON state, draws the drain of the transistor N3 to ground, along with the gates of the transistors P2 and N6.

The cell E2 is, for its part, blocked.

Consequently, the cell CELSR switches to the 0 state, this time storing the logical "0".

It will therefore be noted here that inversion of the datum actually takes place during the reloading of the cell CELSR with the contents of the non-volatile cells E1 and E2.

The reading of a datum into the cell CELSR is also a conventional reading and is illustrated by the reference 24 in FIG. 9.

The read access to the cell is effected by the line of bits BL and the supplementary line of bits $\overline{BL}$, the line of words "WL" being connected to the supply voltage Vdd. One of the two lines of bits is drawn to ground, the other being at the voltage Vdd minus the threshold voltage of an NMOS transistor. The different states of the lines of bits are sent in conventional read circuitry in such a way as to determine the logical value of the read datum.

Figure 10:
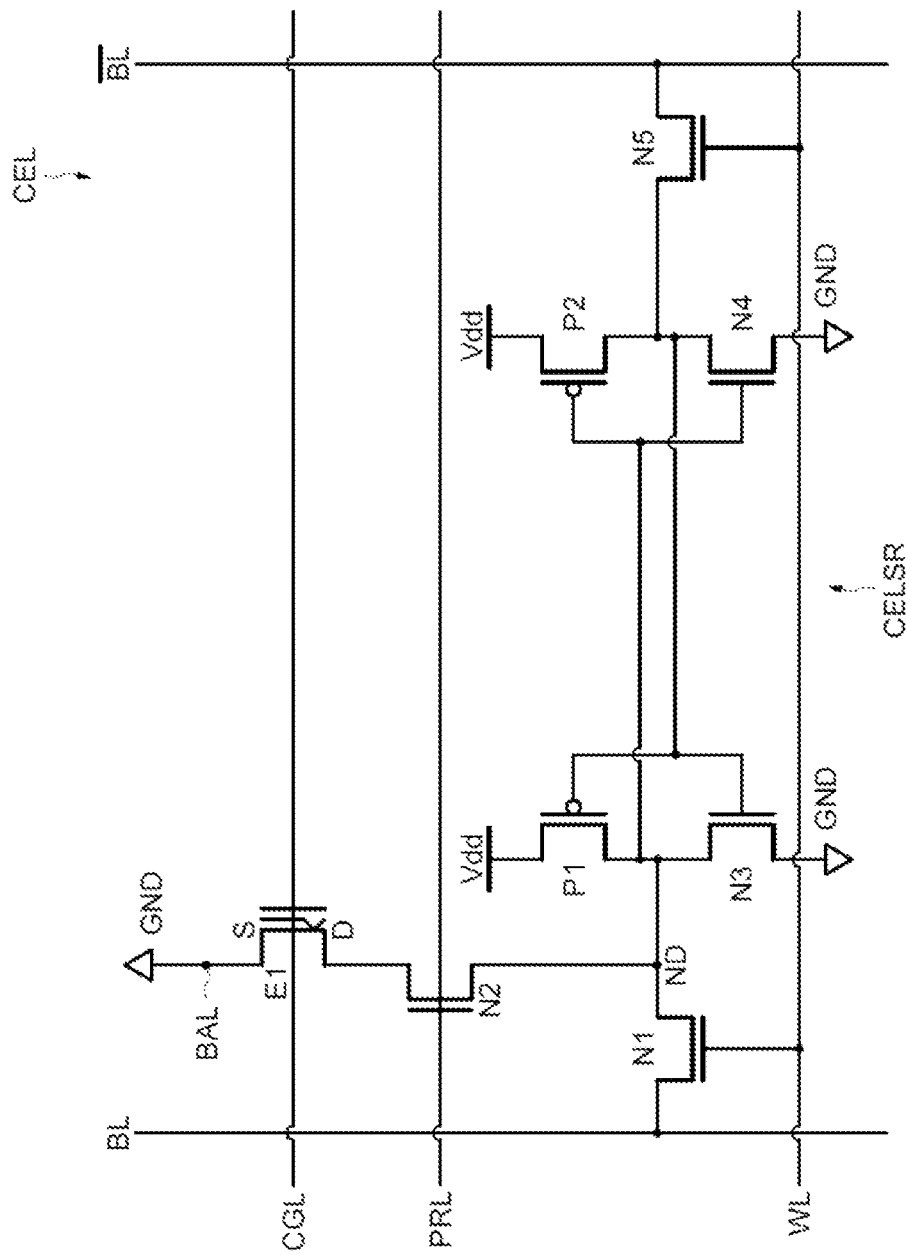

Reference will now be made more particularly to FIG. 10 in order to illustrate a different example of a memory cell CEL configured to invert the datum during a non-volatile reloading to the elementary memory cell CELSR. A cell of this type has been described in the aforementioned French patent application no. 1355440 (applicant docket 13-RO-0200), which is incorporated herein by reference.

In FIG. 10, the memory cell CEL comprises the SRAM elementary memory cell CELSR and a single non-volatile EEPROM elementary cell, here comprising a floating-gate transistor E1.

Here also, the non-volatile EEPROM cell of the cell CEL is a conventional cell, e.g., from which the selection transistor has been removed and having a tunnel injection zone between the floating gate and the drain.

The source of the transistor E1 is connected to a power supply terminal BAL which is connected here to ground.

The control electrode of the floating-gate transistor E1 is for its part connected to a first control line CGL.

Here also, the elementary cell CELSR has a conventional structure and includes a first inverter comprising the transistor PMOS P1 and the NMOS transistor N3, and a second inverter comprising the transistor PMOS P2 and the NMOS transistor N4. These two inverters are connected between a different power supply terminal intended to be connected to the supply voltage Vdd and to ground.

These two inverters are cross-coupled, i.e., the input of the first inverter formed by the gates of the transistors P1 and N3 is connected to the output of the second inverter formed by the drains of the transistors N4 and P2, whereas the input of the second inverter, formed by the gates of the transistors P2 and N4, is connected to the output of the first inverter formed by the drains of the transistors P1 and N3.

The cell CELSR also comprises two NMOS access transistors, denoted N1 and N5, connected between the outputs of the two inverters and two lines of bits BL and $\overline{BL}$ respectively, where $\overline{BL}$ denotes the supplementary line of bits of the line BL.

The gates of the access transistors N1 and N5 are connected to a line of words WL.

The drain of the floating-gate transistor E1 is connected here to the output (node ND) of the first inverter P1, N3 of the elementary memory cell CELSR via an interconnect stage here comprising a first interconnect transistor N2. Here, this single interconnect transistor N2 is an NMOS transistor.

The control electrode (gate) of this first interconnect transistor N2 is connected to a second control line PRL. Consequently, the interconnect stage is controlled by a signal outside the memory cell CEL, e.g., by the control voltage present on the second control line PRL.

It will be noted here that the memory cell CEL comprises eight transistors, which makes it particularly compact.

Reference is now made more particularly to FIG. 11 which is a temporal chronogram illustrating different modes of operation of the memory cell CEL shown in FIG. 1.

The writing in the elementary memory cell CELSR, denoted 20 in FIG. 11, is a conventional writing here also.

More precisely, to write a "1", the line of bits BL is connected to the power supply voltage Vdd (here two volts), whereas the supplementary line of bits $\overline{BL}$ is connected to ground and the line of words WL is connected to the power supply voltage Vdd.

The control line PRL is connected to ground, thereby blocking the interconnect stage. Similarly, the first control line CGL is also connected to ground.

The drain of the transistor N4 and the gates of the transistors P1 and N3 are drawn to ground via the transistor N5 which is in the ON state. A switchover of the latch formed by the two cross-coupled inverters then takes place through switching of the drain of the transistor N3 to Vdd and switching of the drain of the transistor N4 to ground.

When the cell is selected to write a "0" into the elementary cell CELSR, the line of bits BL is connected to ground, the supplementary line of bits $\overline{BL}$ is connected to the supply voltage Vdd and the line of words is also connected to the supply voltage Vdd.

The drain of the transistor N3 and the gate of the transistors P2 and N4 are drawn to ground by the transistor N1 which is in the ON state. A switchover of the latch takes place via the drain of the transistor N3 which switches to ground and via the drain of the transistor N4 which switches to Vdd.

The datum is retained when the cell is deselected.

A transfer or non-volatile storage 21 of the content of the cell CELSR to the non-volatile elementary memory cell E1 will now be described.

As indicated above, a non-volatile transfer or writing comprises an erase cycle and a programming cycle.

For the erase cycle, the line PRL remains connected to ground, thereby blocking the interconnect transistor N2. An erase voltage is then sent on the first control line CGL. In the example described here, this erase voltage comprises a ramp then a plateau having a typical amplitude of 13 volts. The ramp-up can be effected typically in around 0.5 milliseconds, whereas the typical duration of the plateau is 1 millisecond.

Through coupling with the first control line CGL, the floating gate of the transistor E1 goes up to around 9 volts, switching the non-volatile cell to the ON state and forcing the drain region to 0 volt.

The tunnel current discharges the floating gate of E1 to the drain region. Once the voltage on the first control line CGL has returned to idle (0 volt), a negative charge of around −1.5 volt is present on the floating gate of E1.

The cell E1 is then erased.

It is now assumed that the cell CELSR is, for example, positioned to store a "1", e.g., that the source of the transistor N2 (node ND) is connected to the supply voltage Vdd, whereas the source of the other inverter N4, P2 is connected to ground.

The line of words WL is also connected to ground.

The programming cycle is then effected as follows.

The second control line PRL switches to the supply voltage Vdd that has switched here to 4 volts.

Consequently, the interconnect transistor N2 is in the ON state.

A programming voltage is then sent on the first control line CGL.

This programming voltage is a negative voltage formed from a ramp then a plateau with a typical amplitude −8.5 volts. Here also, the duration of the ramp is typically 0.5 milliseconds, whereas the duration of the plateau is typically 1 millisecond.

The floating-gate transistor E1 is blocked.

The transistor N2 in the ON state transfers a voltage equal to Vdd minus the threshold voltage of the NMOS transistor to the drain of the transistor E1.

The floating gate of the transistor E1, previously discharged to −1.5 volt, will drop towards −6.5 volts through capacitive coupling. The difference in potential across the injection zone of the transistor E1 is typically 9.5 volts. Consequently, the floating gate of the transistor E1 will be positively charged due to the tunnel effect.

Once the voltage on the first control line CGL has returned to idle, e.g., at the end of the programming, the positive charge of 1.5 volts on the floating gate of E1 switches this cell to the ON state and to the written state.

It will be noted here that the fact of blocking the floating-gate transistor E1 during the programming avoids short-circuiting the node ND to ground (power supply terminal BAL).

It is now assumed that the cell CELSR is positioned to store a "0", e.g., that the source of the transistor N2 is connected to ground, whereas the output of the inverter P2, N4 is connected to the supply voltage Vdd. The line of words WL is also connected to ground.

The programming cycle is then effected as follows.

Here also, the second control line PRL switches to the supply voltage Vdd, switching the interconnect transistor N2 to the ON state. The programming voltage is then sent on the first control line CGL. This programming voltage is analogous to that sent when the cell CELSR contained a "1".

The floating-gate transistor E1 is therefore blocked.

The transistor N2 in the ON state transfers a zero voltage to the drain of the transistor E1.

The floating gate of the transistor E1, previously discharged to −1.5 volt, will drop towards −7.5 volts through capacitive coupling. The difference in potential across the injection zone of the transistor E1 is this time in the region of 7.5 volts, which is not enough to charge this gate due to the tunnel effect. The floating gate of the transistor E1 therefore remains discharged.

Once the voltage on the first control line CGL has returned to idle, e.g., at the end of the programming, the charge of −1.5 volts on the floating gate of E1 renders this cell blocked and in the erased state.

It should be noted here that the erasure of the non-volatile cell is an unconditional erasure, whereas the programming is selective according to the value of the datum contained in the SRAM cell CELSR, e.g., according to the drain voltage of the non-volatile cell.

It is then assumed that a power loss 22 then a power-up take place. The reloading 23 of the non-volatile datum (e.g., the datum contained in the non-volatile cell E1) into the SRAM cell CELSR will now be described.

Prior to this reloading, an initialization 220 (or a re-initialization) of the SRAM elementary memory cell CELSR is carried out in such a way as to initialize it in a known state and avoid it being in a metastable state.

In the example described here, this initialization 220 is carried out by writing a "1" into the SRAM cell by using the conventional write procedure.

For the reloading, the first control line CGL switches to a read reference voltage, typically 1 volt, whereas the second control line PRL has a voltage of 2 volts, for example in such a way as to switch the interconnect transistor N2 to the ON state.

The voltage of the line of words WL is zero.

If the SRAM cell CELSR initially stored a logical "1" (before a loss of power), and consequently the datum stored in the non-volatile cell E1 (which must be reloaded) is also a logical "1", the non-volatile cell E1, in the ON state, draws the common node ND to ground via the transistor N2 in the ON state. Consequently, the cell CELSR switches to the logical "0" state.

If the cell CELSR initially stored a logical "0", the non-volatile cell E2 is then blocked and the cell CELSR remains in the initialized state, e.g., the logical "1" state.

It is therefore noted that the reloaded datum of the SRAM cell is in fact inverted in relation to the initial datum following a non-volatile transfer to the non-volatile cell followed by a reloading from this non-volatile cell.

It should be noted that, in the embodiment shown in FIG. 1, the interconnect transistor N2 could have been connected to the output of the inverter P2, N4 rather than to the output of the inverter P1, N3. This would not have made any difference with regard to the write cycle (erasure then programming) of the non-volatile cell. Conversely, during the reloading from the non-volatile cell to the SRAM cell, it would then have been necessary to initialize the SRAM cell by writing a logical "0" in such a way as to have the high logical level in the common node of the transistors N2, P2 and P4.

The reading of a datum into the cell CELSR is also a conventional reading and is illustrated by the reference 24 in FIG. 2.

The read access to the cell is effected by the line of bits BL and the supplementary line of bits $\overline{BL}$, the line of words "WL" being connected to the supply voltage Vdd. One of the two lines of bits is drawn to ground, the other being at the voltage Vdd minus the threshold voltage of an NMOS transistor. The different states of the lines of bits are sent into a conventional read circuitry in such a way as to determine the logical value of the read datum.

It should also be noted that, as an alternative, the transistor N2 could have been connected between the power supply terminal and the source of the transistor E1. A datum inversion following a non-volatile reloading would be obtained here also.

The memory device which has just been described may, in all these alternative embodiments, form part of an integrated circuit, incorporated, by way of a non-limiting example, within a chip of a contactless product, for example a contactless chip card.

What is claimed is:

1. A method for managing the operation of a memory cell that comprises an SRAM elementary memory cell and a non-volatile elementary memory cell coupled to one another, the method comprising:
   transferring a data bit between the SRAM elementary memory cell and the non-volatile elementary memory cell;
   storing a control datum in a control memory cell that is functionally analogous to and associated with the memory cell;
   reading the data bit from the SRAM elementary memory cell;
   performing a corresponding read of the control datum; and
   inverting the data bit read from the SRAM elementary memory cell if the control datum has a first value while not inverting the data bit read from the SRAM elementary memory cell if the control datum has a second value.

2. The method according to claim 1, wherein transferring the data bit between the SRAM elementary memory cell and the non-volatile elementary memory cell comprises transferring the data bit from the SRAM elementary memory cell to the non-volatile elementary memory cell.

3. The method according to claim 1, wherein transferring the data bit between the SRAM elementary memory cell and the non-volatile elementary memory cell comprises transferring the data bit from the non-volatile elementary memory cell to the SRAM elementary memory cell.

4. The method according to claim 1, wherein the control datum has the first value when the data has been written to the SRAM elementary memory cell an odd number of times from the non-volatile memory cell since the SRAM elementary memory cell has been written to from a source external to the memory cell and wherein the control datum has the second value when the data has been written to the SRAM elementary memory cell an even number of times since the SRAM elementary memory cell has been written to from a source external to the memory cell.

5. The method according to claim 1, wherein the memory cell is one cell in a set that includes a plurality of blocks, each block including a plurality of memory cells, wherein a control memory cell is associated with each block of memory cells.

6. The method according to claim 5, wherein the control datum has the first value when the data has been written to the block of memory cells an odd number of times since the block of memory cells has been written to from a source external to the block, wherein the control datum has the second value when the data has been written to the block of memory cells an even number of times since the block of memory cells has been written to from a source external to the block, and wherein the inverting or not inverting is performed for each memory cell in the block of memory cells when the memory cells of the block are read.

7. The method according to claim 1, wherein the memory cell is one cell in a set that includes a plurality of subsets of a plurality of blocks of a plurality of memory cells, wherein a control memory cell is associated with each subset of blocks of memory cells, wherein the control datum has the first value when the data has been written to the subset of memory cells an odd number of times since the subset of memory cells has been written to from a source external to the block of memory cells, wherein the control datum has the second value when the data has been written to the subset of memory cells an even number of times since the subset of memory cells has been written to from a source external to the block of memory cells, and wherein the inverting or not inverting is performed for each memory cell in the subset of memory cells when the memory cells of the subset are read.

8. The method according to claim 7, wherein data of other SRAM elementary memory cells of other blocks of the subset are read and inverted read data is overwritten into these other SRAM elementary memory cells of the other blocks when datum from the subset of memory cells is inverted.

9. The method according to claim 1, wherein the first value is a logical value equal to 0 and the inverting or not inverting comprises applying an EXCLUSIVE OR logical function to the data bit read from the SRAM elementary memory cell and to the control datum read from the control memory cell.

10. The method according to claim 1, wherein the non-volatile elementary memory cell comprises an EEPROM cell.

11. A method for managing the operation of a set that includes a memory cell that comprises an SRAM elementary memory cell and a non-volatile elementary memory cell coupled to one another, the memory cell being configured to carry out a datum value inversion in a reloading a datum previously written into the non-volatile elementary memory cell into the SRAM elementary memory cell, the method comprising:
 with each transfer of a datum from the SRAM elementary memory cell into the non-volatile elementary memory cell and with each reloading of the SRAM elementary memory cell, performing the same operations on a control datum of a control memory cell that is functionally analogous to and associated with the memory cell; and
 with each reading of a datum of the SRAM elementary memory cell, performing a corresponding reading of the control datum, and the datum read from the SRAM elementary memory cell being inverted or not according to the value read from the control datum.

12. The method according to claim 11, wherein in a first writing of a datum into the SRAM elementary memory cell of the memory cell, following an odd number of reloading(s) of the SRAM elementary memory cell since the last writing into the SRAM elementary memory cell, writing the control datum having a first value into the control memory cell;
 if a read control datum value is equal to a second value different from the first value, inverting the value of the datum of the SRAM elementary memory cell of the memory cell upon reading and delivering the inverted datum; and
 if the read control datum is equal to the first value, delivering the datum read from the SRAM elementary memory cell of the memory cell with no inversion.

13. The method according to claim 12, further comprising, prior to writing the control datum having the first value into the control memory cell, reading the value of the control datum from the control memory cell, a read value of the control datum equal to the second value indicating that the writing of a datum into the SRAM elementary memory cell of a memory cell is a first writing following an odd number of reloading(s) since the last writing into the SRAM elementary memory cell.

14. The method according to claim 12, wherein the first value is a logical value equal to 0 and wherein delivering inverted or actual data comprises applying an EXCLUSIVE OR logical function to the datum read from each SRAM elementary memory cell and to the control datum read from the associated control memory cell.

15. The method according to claim 11, wherein the set includes a plurality of blocks of memory cells, wherein a control memory cell is associated with each block of memory cells;
 wherein, in a first writing of a data block into a block of SRAM elementary memory cells of a corresponding block of memory cells, following an odd number of reloading(s) the block of SRAM elementary memory cells since the last writing into the block of SRAM elementary memory cells, the control datum having a first logical value is written into the associated control memory cell;
 in response to a command to read contents of each SRAM elementary memory cell of the block, reading the control data of the associated control memory cell;
 if the read value of the control datum is equal to a second value different from the first value, inverting the value of the datum of each SRAM elementary memory cell of the block is and delivering inverted datum; and
 if the read value of the control datum is equal to the first value, delivering the datum actually read from each SRAM elementary memory cell of the block.

16. The method according to claim 11, wherein the set includes a plurality of subsets of a plurality of blocks of a plurality of memory cells, wherein a control memory cell is associated with each subset of blocks of memory cells;
 wherein, in a first writing of a data block into a block of SRAM elementary memory cells of a subset of memory cells, following an odd number of reloading(s) of the subset of SRAM elementary memory cells since the last writing into the block of SRAM elementary memory cells of this subset, the control datum having a first logical value is written into the associated control memory cell, and the data of other SRAM elementary memory cells of the other blocks of the subset are read and the read but inverted data are overwritten into these other SRAM elementary memory cells of the other blocks;
 in response to a command to read the contents of each SRAM elementary memory cell of the subset, reading the contents of the control memory;

if the read value of the control datum is equal to a second value different from the first value, inverting the value of the datum of each SRAM elementary memory cell of the subset and delivering each inverted datum; and if the read value of the control datum is equal to the first value, delivering the datum actually read from each SRAM elementary memory cell of the subset.

17. The method according to claim 16, comprising, in response to each command to write at least one data block into at least one block of SRAM elementary memory cells of a subset of memory cells, reading the corresponding control datum;

if the control datum has the second value, writing of the data block into the at least one block of SRAM elementary memory cells of the subset of memory cells, writing the control datum having the first value into the associated control memory cell, reading the data of other SRAM elementary memory cells of the other blocks of the subset, and overwriting the read data with inverted read data into the other SRAM elementary memory cells of the other blocks; and if the control datum has the first value, writing of the data block into the at least one block of SRAM elementary memory cells of the subset of memory cells.

18. The method according to claim 11, wherein the non-volatile elementary memory cell comprises an EEPROM cell.

19. A memory device, comprising:
a set that includes a plurality of memory cells, each memory cell including an SRAM elementary memory cell and a non-volatile elementary memory cell coupled to one another;
a control memory cell that is functionally analogous to a first memory cell of the plurality of memory cells and is associated with the first memory cell;
a first processing circuit configured, with each transfer of a datum from the SRAM elementary memory cell into the non-volatile elementary memory cell of the first memory cell and with each reloading of the SRAM elementary memory cell of the first memory cell, to perform the same corresponding operations on a control datum of the control memory cell; and
a second processing circuit configured, with each reading of a datum from the SRAM elementary memory cell of the first memory cell, to carry out a corresponding reading of the control datum and to perform an inversion or not of the datum read from the SRAM elementary memory cell according to the read value of the control datum.

20. The device according to claim 19, further comprising a third processing circuit configured, in the first writing of a datum into the SRAM elementary memory cell of the first memory cell, following an odd number of reloading(s) of the SRAM elementary memory cell since the last writing into the SRAM elementary memory cell, to write the control datum having a first value into the SRAM elementary memory cell of the control memory cell;
wherein the second processing circuit is configured to read the contents of the control memory cell in response to a command to read the contents of the SRAM elementary memory cell of the at least one memory cell;
wherein, if the read value of the control datum is equal to a second value different from the first, the second processing circuit is configured to invert the value of the datum of the SRAM elementary memory cell of the first memory cell and to deliver the inverted datum; and
wherein, if the read value of the control datum is equal to the first value, the second processing circuit is configured to deliver the datum actually read from the SRAM elementary memory cell of the first memory cell.

21. The device according to claim 20, wherein the third processing circuit is configured, prior to writing of the control datum having the first value into the control memory cell, to read the value of the control datum from the control memory cell, a read value of the control datum equal to the second value indicating that the writing of a datum into the SRAM elementary memory cell of a memory cell is a first writing following an odd number of reloading(s) since the last writing into the SRAM elementary memory cell.

22. The device according to claim 20, wherein the first value is a logical value equal to 0 and wherein the second processing circuit comprises, for each SRAM elementary memory cell of each memory cell, an EXCLUSIVE OR logical operator configured to receive at the input the datum read from the SRAM elementary memory cell and the control datum read from the SRAM elementary memory cell of the associated control memory cell.

23. The device according to claim 19, wherein the set includes a plurality of blocks memory cells, a control memory cell being associated with each block of memory cells;
wherein the device further comprises a third processing circuit configured, in a first writing of a data block into a block of SRAM elementary memory cells of the corresponding block of memory cells, following an odd number of reloading(s) of the block of SRAM elementary memory cells since the last writing into the block of SRAM elementary memory cells, to write the control datum having a first logical value into the SRAM elementary memory cell of the associated control memory cell;
wherein the second processing circuit is configured to read the contents of the SRAM cell of the associated control memory cell in response to a command to read the contents of each SRAM elementary memory cell of the block;
wherein, if the read value of the control datum is equal to a second logical value different from the first, the second processing circuit is configured to invert the value of the datum of each SRAM elementary memory cell of the block and to deliver each inverted datum; and
wherein, if the read value of the control datum is equal to the first logical value, the second processing circuit is configured to deliver the datum actually read from each SRAM elementary memory cell of the block.

24. The device according to claim 19, wherein the set includes a plurality of subsets of a plurality of blocks of a plurality of memory cells, a control memory cell being associated with each subset of blocks of memory cells;
wherein the device further comprises a third processing circuit configured, in a first writing of at least one data block into at least one block of SRAM elementary memory cells of a subset of memory cells, following an odd number of reloading(s) of the subset of SRAM elementary memory cells since the last writing into at least one block of SRAM elementary memory cells of this subset, to write the control datum having a first logical value into the control memory cell, to read the data contained in the other SRAM elementary memory cells of the other blocks of the subset, and to overwrite the read but inverted data into these other SRAM elementary memory cells;
wherein the second processing circuit is configured to read the contents of the SRAM cell of the control memory cell in response to a command to read the contents of each SRAM elementary memory cell of the subset;

wherein, if the read value of the control datum is equal to a second logical value different from the first, the second processing circuit is configured to invert the value of the datum of each SRAM elementary memory cell of the subset and two deliver each inverted datum; and wherein, if the read value of the control datum is equal to the first logical value, the second processing circuit is configured to deliver the datum actually read from each SRAM elementary memory cell of the subset.

25. The device according to claim 24, wherein the third processing circuit is configured to read the corresponding control datum, in response to each command to write at least one data block into at least one block of SRAM elementary memory cells of a subset of memory cells;

wherein, if the control datum has the second value, the second processing circuit is configured to write the data block into the at least one block of SRAM elementary memory cells of the subset of memory cells, to write the control datum having the first value into the SRAM elementary memory cell of the associated control memory cell, to read the data from the other SRAM elementary memory cells of the other blocks of the subset, and to overwrite the read with inverted read data into these other SRAM elementary memory cells of the other blocks; and wherein, if the control datum has the first value, the second processing circuit is configured to write the data block into the at least one block of SRAM elementary memory cells of the subset of memory cells.

26. The device according to claim 19, wherein the SRAM elementary memory cell of each memory cell comprises two inverters cross-coupled to one another, wherein the non-volatile elementary memory cell of each memory cell comprises a floating-gate transistor connected between a power supply terminal and a first output of the two inverters, and wherein each memory cell further comprises an interconnect transistor coupled in series between the power supply terminal and the floating-gate transistor or between the floating-gate transistor and the first output of the two inverters.

27. The device according to claim 19, wherein the SRAM elementary memory cell of each memory cell comprises two inverters cross-coupled to one another, wherein each memory cell comprises a plurality of non-volatile elementary memory cells, each non-volatile elementary memory cell having a floating-gate transistor, the floating-gate transistors having first conduction electrodes connected to a power supply terminal and second conduction electrodes connected to the outputs of the two inverters via two interconnect transistors.

28. The device according to claim 19, wherein each non-volatile elementary memory cell comprises an EEPROM cell.

* * * * *